United States Patent
Hyun et al.

(10) Patent No.: US 8,982,624 B2
(45) Date of Patent: Mar. 17, 2015

(54) ADJUSTABLE READ TIME FOR MEMORY

(71) Applicant: Fusion-io, Inc., Salt Lake City, UT (US)

(72) Inventors: Jea Woong Hyun, South Jordan, UT (US); Barrett Edwards, Salt Lake City, UT (US); David Nellans, Salt Lake City, UT (US)

(73) Assignee: Fusion-IO, LLC, Wilmington, DE (US)

( * ) Notice: Subject to any disclaimer, the term of this patent is extended or adjusted under 35 U.S.C. 154(b) by 213 days.

(21) Appl. No.: 13/633,833

(22) Filed: Oct. 2, 2012

(65) Prior Publication Data

US 2014/0092683 A1 Apr. 3, 2014

(51) Int. Cl.
*G11C 16/06* (2006.01)
*G11C 16/26* (2006.01)
*G11C 16/32* (2006.01)

(52) U.S. Cl.
CPC ............... *G11C 16/26* (2013.01); *G11C 16/32* (2013.01)

USPC ................. 365/185.09; 365/185.29; 365/191; 365/189.011; 365/233.1

(58) Field of Classification Search
USPC ................ 365/185.09, 185.29, 191, 189.011, 365/233.1
See application file for complete search history.

(56) References Cited

U.S. PATENT DOCUMENTS

| | | | | |
|---|---|---|---|---|
| 6,252,821 | B1 * | 6/2001 | Nizar et al. | 711/202 |
| 7,120,727 | B2 * | 10/2006 | Lee et al. | 711/5 |
| 7,966,444 | B2 * | 6/2011 | Lee et al. | 711/5 |
| 8,200,884 | B2 * | 6/2012 | Lee et al. | 711/5 |
| 8,504,782 | B2 * | 8/2013 | Jeddeloh | 711/154 |
| 8,732,383 | B2 * | 5/2014 | Lee et al. | 711/5 |

* cited by examiner

*Primary Examiner* — Pho M Luu
(74) *Attorney, Agent, or Firm* — Kunzler Law Group, PC

(57) ABSTRACT

A method includes initiating a read process for a memory array of an electronic memory device to make data available at an I/O buffer of the electronic memory device for access by a controller. A method includes signaling completion of a read process prior to completion of one or more stages of the read process at a memory array.

31 Claims, 9 Drawing Sheets

ADJUSTABLE READ TIME FOR MEMORY

BACKGROUND

Flash memory stores data in arrays of memory elements, or cells, formed from floating-gate transistors. NAND flash memory devices return previously stored data by reading a series of bits from individual cells in an array. Within the array, an analog charge level can be stored in each cell. A sense amplifier connected to the array senses and converts the charge level from an analog format to a digital format. When used to represent binary numbers, the digital representation of the analog charge level stored in the cell can be recognized as a 0 or 1 value.

Charge leakage, or transfer, can alter the analog charge level stored in each cell. This changes the voltage level that is sensed and converted to the digital format. As a result, the digital value that is read can be different from the value that was originally stored, or programmed, in the cell. This problem is often referred to as a bit flip. Some bit flips can be detected and corrected by error correction code (ECC). The number of bit flips that can be detected and corrected is dependent on the amount of ECC processing resources available within a particular system.

As cell geometries get smaller with improved semiconductor fabrication techniques, the smaller geometries can cause an increase in bit-line capacitance. Bit-line capacitance refers to the interference caused by a signal on one bit-line of the array with another signal on another bit-line of the array. To deal with potential problems resulting from increased bit-line capacitance, sense amplifiers may be more sensitive to distinguish between relatively small voltage differentials, which establish the thresholds between digital values used to represent the analog charge levels. Otherwise, a bit flip may occur. The sensitivity of a sense amplifier can typically be improved by increasing the amount of time that the sense amplifier is allowed to access, or read, the analog charge level from a corresponding cell. This time that the sense amplifier is sensing and converting the analog charge level, along with pre- and post-processing activities, is often referred to as the read time (tREAD) of the array. Thus, typical tREAD times in NAND flash memory devices are increasing to compensate for smaller geometries and increased bit-line capacitance. This increase in tREAD times results in longer overall times to access data from a NAND flash memory device.

BRIEF DESCRIPTION OF THE DRAWINGS

Throughout the description, similar reference numbers may be used to identify similar elements.

DETAILED DESCRIPTION

Figure 1:
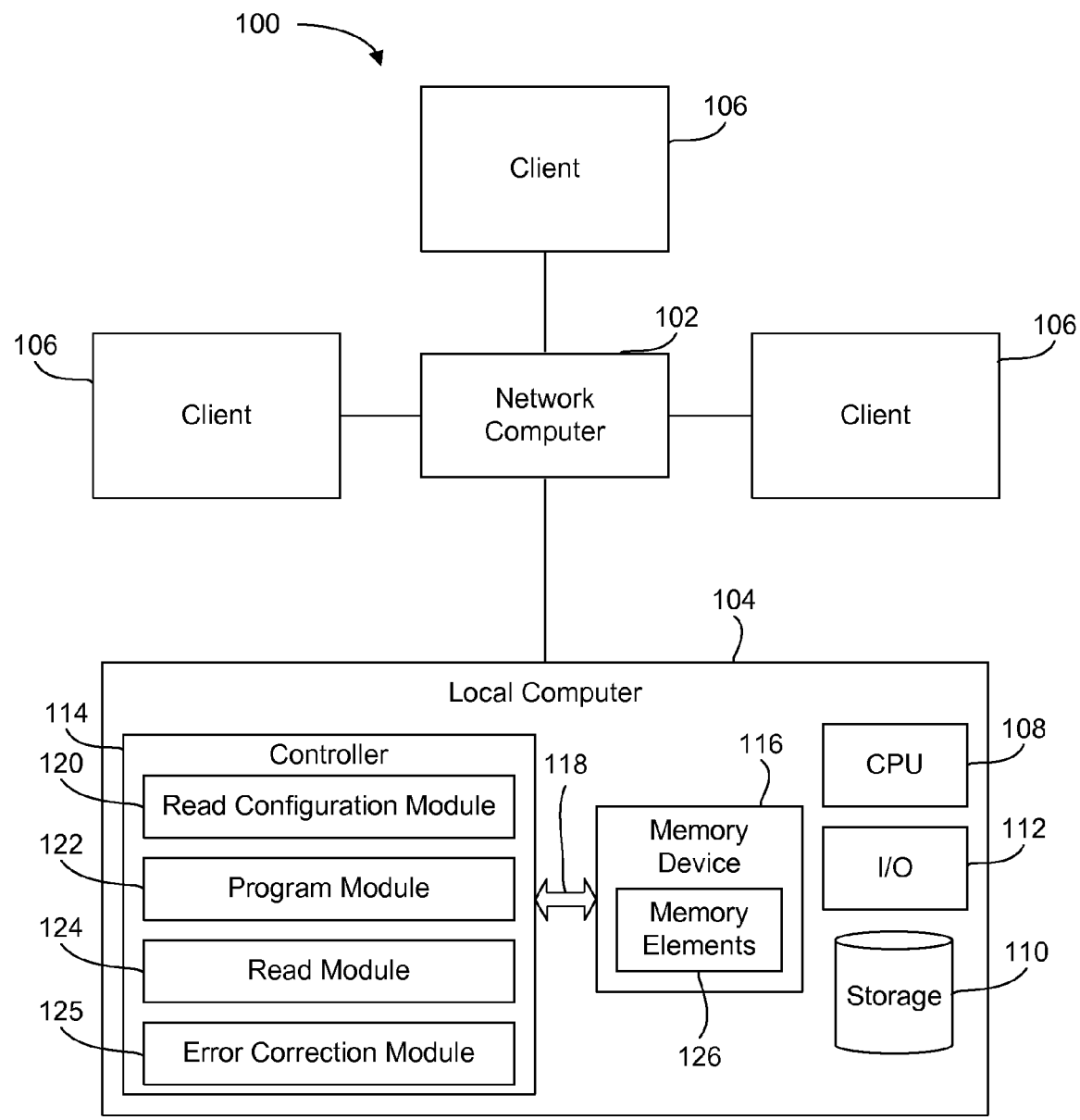
FIG. 1 depicts a schematic diagram of one embodiment of a network system which includes a local computer having a controller for a memory device.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Reference to a computer readable medium may take any physical form capable of storing machine-readable instructions, at least for a time in a non-transient state, on a digital processing apparatus. A computer readable medium may be embodied by a compact disk, digital-video disk, a blu-ray disc, a magnetic tape, a Bernoulli drive, a magnetic disk, flash memory, integrated circuits, or other digital processing apparatus memory device.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments facilitate a tunable read time (tREAD) of a NAND flash die. As used herein, the read time refers to the time that elapses at the NAND flash die from when the read process is initiated until data is capable of being read by a corresponding controller or other requesting device external to the NAND flash die. In some embodiments, the availability of the data is established by the NAND flash die. For example, the NAND flash die may prevent access or delay granting authorization to access to the data until a status bit is set or other authorization is provided to the controller. In other embodiments, the availability of the data is established by the controller. For example, the controller may commence reading out the data regardless of the state of the NAND flash die.

The ability to tune, or change, the read time of a NAND flash die can be predictive or reactive relative to another performance parameter of the NAND flash die. For example, changing the read time can depend on a historical value of the raw bit error rate (RBER) of the NAND flash die. Alternatively, changing the read time can depend on a predicted (or desired) value of the RBER. In this way, the read time can change over time in relationship to the RBER. In other embodiments, the read time may be adjusted based on other performance parameters such as program/erase (P/E) cycles and so forth, or on a combination of performance parameters.

Compared with conventional approaches, the read time of embodiments described herein is not solely determined by the hardware design of the device. A user or an automated controller can adjust the read time of a NAND flash die independently of the basic hardware design that is implemented. In some embodiments, a controller may begin streaming data from the NAND flash die buffers at an arbitrary time after issuing a read command. Alternatively, the controller and/or the NAND flash die may set the read time parameter to a fixed, but adjustable time value before authorizing the controller to stream out the data.

Thus, while NAND flash read times have been getting slower and slower, because of smaller device geometries and increased bit-line capacitances, embodiments described herein facilitate modifying the read time to compensate for predicted or actual changes in RBER or other performance parameters of the NAND flash die. Additionally, some embodiments also take into account the error correction code (ECC) capabilities of the controller (or other hardware) to allow for further modifications in the read time of a particular device. Although conventional read times are established through hardware designs that are intended to achieve a particular level of performance based on assumptions of life expectancy and minimum ECC capabilities, stronger ECC capabilities in a particular system may be able to compensate for increase bit read errors, which allows shorter read times without a significant loss in overall read accuracy. In other words, some embodiments described herein allow changes to decrease the read time, despite an expected increase in bit read errors, because ECC capabilities are anticipated to compensate for the increase in bit read errors, resulting in overall faster read times without a decrease in read accuracy.

FIG. 1 depicts a schematic diagram of one embodiment of a network system 100. The depicted network system 100 includes various components, described in more detail below, that are capable of performing the functions and operations described herein. In one embodiment, at least some of the components of the network system 100 are implemented in a computer system. For example, the functionality of one or more components of the network system 100 may be implemented by computer program instructions stored and executed on a network computer device 102. The network system 100 may include other components, such as a local computer 104 and one or more clients 106. The local computer 104 may include various components, including a processor 108 (such as a CPU), a storage device 110, input/output devices 112, a controller 114, and a memory device 116. Some or all of the components of the network system 100 may be stored on a single computing device or on a network of computing devices, including a wireless communication network. The network system 100 may include more or fewer components or subsystems than those depicted herein. In some embodiments, the network system 100 may be used to implement the methods described herein.

In one embodiment, the controller 114 includes a physical input/output (I/O) interface 118 configured to couple the controller 114 to the memory device 116. In various embodiments, the controller 114 may be implemented by hardware, firmware, a driver, or other implementations capable of controlling operations in a memory device 116.

The memory device 116 includes one or more memory elements 126. In one embodiment, the memory device 116 is a NAND flash memory device. Other embodiments may incorporate other types of electronically erasable programmable memory devices or non-volatile memory such as phase-change memory (PCM). In some embodiments, the memory device 116 is a single die with an array of memory elements 126, which array is referred to herein as a memory array. In other embodiments, the memory device 116 corresponds to an integrated circuit (IC) package, or chip. Each chip may include one or more die, and each die includes an array of memory elements 126. In some embodiments, a common circuit board is used to mount a plurality of IC packages or chips, which arrangement is referred to herein as a chip array or a NAND array. For example, a chip array of 8, 16, 32, etc. chips may be mounted to a peripheral memory card that can be connected to a peripheral slot of a computer. In some embodiments, the controller 114 is also mounted to the same circuit board as the chip array. Alternatively, the controller 114 may be located remotely (i.e., on a different circuit board) from one or more circuit boards with a chip array with which the controller 114 communicates.

The memory device 116 may be used for storing data associated with the local computer 104 and/or the network system 100. Although the local computer 104 is shown with a single memory device 116, other embodiments of the local computer 104 may include more than one memory device 116. Similarly, multiple memory devices 116 may be implemented at various locations within the nodes of the computer network. Embodiments of the network system 100 may provide dedicated or shared memory resources for one or more of the clients 106 and local computer 104, though other implementations of storage/memory resources or capacity may be used in conjunction with the network system 100.

The memory elements 126 may be operated in a variety of modes. In general, solid-state memory elements 126 can be set to different programmable states that correspond to different bits or bit combinations. In a specific example, the memory elements 126 may be operated in a single level cell (SLC) to store a single bit of data. In another example, the memory elements 126 may be operated in a multiple level cell (MLC) mode to store two or more bits of data. In another example, the memory elements 126 may be MLC memory elements configured to operate in an SLC mode. In other embodiments, the memory device 116 includes other types of memory elements 126.

In various embodiments, the memory device 116 may be a non-volatile memory device 116 in the form of a dual-inline memory module ("DIMM"), a daughter card, or a micro-module. In another embodiment, the memory device 116 is an element within a rack-mounted blade. In another embodiment, the memory device 116 is contained within a package that is integrated directly onto a higher level assembly (e.g., mother board, laptop, graphics processor, etc.). In another embodiment, individual components including the memory device 116 are integrated directly onto a higher level assembly without intermediate packaging.

The illustrated controller 114 includes a read configuration module 120, a program module 122, a read module 124, and an error correction module 125. Other embodiments, of the controller 114 may include fewer or more modular components.

In one embodiment, the program module 122 programs one or more bits of a memory element 126 of the memory device 116. The memory elements 126 may be programmed to different states depending on the desired bit configuration for each memory element 126. The manner in which the memory elements 126 might be programmed does not impact the read configuration functionality described herein. The read module 124 reads at least one data bit from the memory element 126. The manner in which the read configuration is established herein may affect some aspects of the read process implemented by the read module 124.

In one embodiment, the read configuration module 120 determines, monitors, and/or sets a read time (tREAD) of the memory device 116. The read time refers to the time it takes for the memory device 116 to read the settings, or charge values, of the memory elements 126 in a word line and make corresponding digital signals available to the controller 114. In some embodiments, the overall read process includes the time it takes for the memory device 116 to perform a pre-processing stage, a development stage, and a post-processing stage. The pre- and post-processing stages also may be referred to as pre- and post-charge stages. The development stage may include one or more sense operations. For example, in a SLC device, the development stage may include a single sense operation. As another example, a read operation for an upper page of a MLC device may include two or more iterative sense operations. Additionally, in some embodiments, the development stage may include multiple charge and/or discharge operations. In conventional devices, the data is made available to the controller 114 after the post-charge stage completes (and potentially after another brief delay for a prefetch operation), which may be approximately 30-40 microseconds for lower page data and approximately 50-60 microseconds for upper page data. In some specific embodiments, the read time for lower page data is about 35 microseconds. Utilizing the embodiments described herein, the read time for the lower page and/or upper page read processes may be changed independently of the hardware design of the memory device 116.

In some embodiments, the performance parameters or device characteristics of the memory device 116 influence how and/or when the read configuration module 120 modifies the read time of the memory device 116. In one embodiment, the device characteristics include usage statistics of the memory elements 126. In various embodiments, the usage statistics may include program/erase (P/E) cycle counts per erase block (EB), bit error rate (BER, as well as the RBER and/or UBER), typical application temperature, and/or other usage statistics. In another embodiment, the device characteristics include the geometric size of the memory element 126 (e.g. 24 nanometers (nm), 21 nm, 32 nm, etc.), the manufacturer, the number of failed cells or other physical or inherent characteristics of the memory element 126.

In some embodiments, the read configuration module 120 proactively changes the read time of the memory device 116 prior to a substantial loss in read accuracy. For example, the controller 114 may monitor a number of P/E cycles of the memory device 116 and implement a change to reduce the read time of the memory device 116, early in the lifecycle of the memory device 116, in order to take advantage of previously under-utilized ECC capabilities. This type of change may be independent of the RBER or other indications of read accuracy.

In some embodiments, the read configuration module 120 reactively changes the read time of the memory device 116 in response to a prompt or trigger event. The prompt or trigger event may be recognized by the controller 114, which initiates the change in the read time. Alternatively, the prompt or trigger event may be generated by the controller 114 and sent to the memory device 116, which implements the change in the read time. As one example, the controller 114 may monitor the RBER for the memory device 116 and adjust the read time in a closed-loop fashion to use as much of the ECC capability as possible for the memory device 116. In some embodiments, the read configuration module 120 is further configured to change the read time of the memory device 116 in relation to a characteristic of the ECC capabilities available at the controller 114. As one example, the read configuration module 120 may take into account the relative strength of the ECC capabilities.

In one embodiment, the error correction module 125 implements the error correction processes for the data read from the memory device 116. The ECC capability may include hardware, software, and/or firmware error correction. The ECC capability of the hardware error correction may be a fixed ECC capability. Alternatively, the ECC capability may be a configurable combination of hardware and software. In either case, the read configuration module 120 may adjust the read time of the memory device 116 such that the RBER for the memory device 116 increases to use more error correction capability.

In some embodiments, the read time of the memory device 116 may be decreased until the RBER is approximately equal to a maximum ECC capability of the controller 114. Reducing the read time in this manner may increase overall read performance by as much as about 50%, depending on the amount of time that is saved compared with conventional read processes. As one example, a savings of about 3-4 microseconds would be about 10% savings for a conventional 35 microsecond read process. As the memory device 116 ages and the memory elements 126 are less capable of holding a specific charge, the read time can be increased. Increasing the read time of the memory device 116 can improve the RBER, requiring less ECC capability, in order to compensate for the decreased performance of individual memory elements 126 which otherwise may increase the need for additional ECC resources. The changes in read may be determined by monitoring the RBER for a certain number of P/E cycles and/or read cycles.

Additionally, while many flash device manufacturers specify an ECC capability to implement with the memory device to get reliable data access, using components with greater ECC capabilities can accommodate further performance advantages. As one example, implementing an ECC scheme that can correct 39 bits/960 Bytes in current generation processes is stronger than the 24 bits/1 kB that may be specified as an ECC requirement on a particular memory device. Other embodiments may use other ECC schemes that are capable of correcting more or less bits.

Because the ECC strength and read time are inversely related, relative to the overall read accuracy, there are a variety of performance/ECC levels that a single NAND chip might be able to provide. While device manufacturers and vendors conventionally design to a single, static set of criteria, which is typically tied to end-of-life performance scenarios, embodiments described herein are capable of dynamically adjusting over time to accommodate different levels of performance and/or different combinations of performance parameters in order to maintain a relatively stable level of performance. By profiling a curve of RBER and read time, a single memory device 116 may be usable in a variety of situations. For example, by designing to ECC standards compatible with lower program/erase (P/E) cycles, when the RBER is typically much lower than end-of-life performance scenarios, there may be additional headroom to decrease the read time initially, and then increase the read time as the RBER increases (or as the P/E cycles increase). This approach relies on the ability to use more of the total ECC capacity in the design to compensate for any increase in errors due to the implementation of shorter read times.

Thus, embodiments and method described herein facilitate changing the read time (tREAD) of a NAND memory die during the lifetime of the device. Some embodiments and methods specifically relate to reducing the read time, while other embodiments and methods may be implemented to increase the read time. The read time may be adjusted by actions of the controller 114, the memory device 116, or a combination of these system and/or other system components.

Although many different approaches may be implemented to change the read time of a memory device 116, some specific examples include a status disregard protocol, an early status protocol, and a stage duration protocol. In the status disregard protocol, the controller 114 initiates a STREAM operation to transfer data from an I/O buffer of the electronic memory device 116 without consideration for a value of a status bit in a status register of the electronic memory device 116. In the early status protocol, the electronic memory device 116 sets the status bit in the status register prior to completion of all stages of a read process. In the stage duration protocol, the electronic memory device 116 completes all stages of the read process within a specific time frame.

Figure 2:
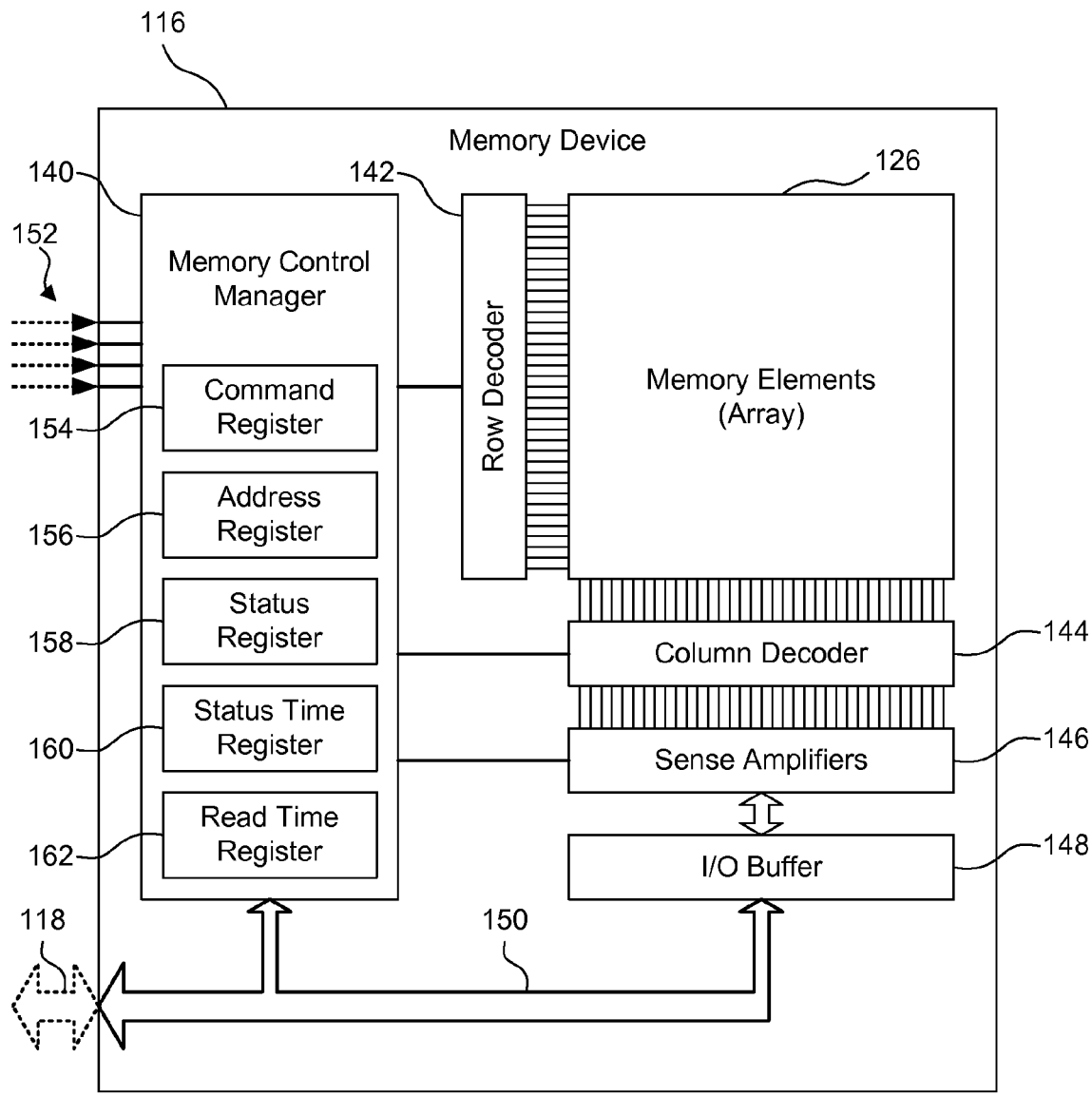
FIG. 2 depicts a schematic diagram of one embodiment of the memory device of FIG. 1.

FIG. 2 depicts a schematic diagram of one embodiment of the memory device 116 of FIG. 1. The illustrated memory device includes the memory elements 126, a memory control manager 140, a row decoder 142, a column decoder 144, a plurality of sense amplifiers 146, an input/output (I/O) buffer 148, and an I/O bus 150. Although the memory device 116 is shown in FIG. 2 with certain components and described herein with certain functionality, other embodiments of the memory device 116 may include fewer or more components to implement similar or different functionality.

In general, the memory control manager 140 controls read and write operations at the memory elements 126. The read and write operations are collectively referred to as memory access operations. The memory control manager 140 controls the application of different voltage levels at the row decoder 142 and/or the column decoder 144 to perform the memory access operations at some or all of the memory elements 126. Although the memory device 116 is shown with only a single array of memory elements 126, other embodiments may include multiple arrays of memory elements 126, in which case each array may have its own row decoder 142 and column decoder 144, but may share the same memory control manager 140.

In one embodiment, control signals from the controller 114 are transmitted to the memory device 116 via one or more control signal lines 152. Some examples of possible control signals include, but are not limited to chip select, read, write, and address signals. Similarly, data is transferred between the controller 114 and the memory device 116 via a data bus 150 (e.g., 8-bit). Within the memory device 116, the data bus 150 may be coupled to the memory control manager 140 and the I/O buffer 148. Other embodiments may use a different number or configuration of communication channels for control, address, and data signals between the controller 114 and the memory device 116.

In order to perform a read operation, the controller 114 may send a read signal to the memory control manager 140. The read signal may include a read command and an address (or range of addresses). In one embodiment, the memory control manager 140 stores the read command in a command register 154. Similarly, the memory control manager 140 stores the address(es) in an address register 156. Upon initiating the corresponding read process, the memory control manager 140 may store a status bit value in a status register 158 to indicate that the memory control manager 140 is busy processing the read command. As an example, the memory control manager 140 may store a bit value of zero (0) in the status register 158 to indicate that the memory control manager 140 is busy processing the read command, although other embodiments may use other bit quantity/value conventions. Storing a bit value in the status register 158 may allow the controller 114 to check the status bit in order to determine if the memory device 116 is busy processing a read command.

In order to retrieve the stored data from the memory elements 126, the memory control manager 140 uses the address (es) to read out column values for a given row (or rows) within the array. In particular, the memory control manager 140 controls the row decoder 142 to activate a particular row and, simultaneously, controls the column decoder 144 to transfer column values from the selected row of memory elements 126 to corresponding sense amplifiers 146. The sense amplifiers 146 convert the stored analog signals to corresponding digital values, amplify the signals as needed, and transfer the digital signals to the I/O buffer 148.

Once initial data from the memory elements 126 is available at the I/O buffer 148, the memory control manager 140 may set the status bit within the status register 158 to indicate that the controller 114 can request the data retrieved from the memory elements 126. For example, the memory control manager 140 may store a bit value of one (1) in the status register 158 to indicate that the memory control manager 140 is done processing the initial data of the read command. In some embodiments, the initial data stored in the I/O buffer 148 may be distinct from the data that is actually read out of the I/O buffer 148. Although a read command my request data starting at a particular column of a word line, the I/O buffer 148 initially may store the data from the first column (or another column) of the word line, rather than from the specified column. This may facilitate a type of pre-fetch operation. If the pre-fetched initial data is different from the requested data, then the pre-fetched initial data may be replaced in the I/O buffer 148 by the data from the requested columns of the word line. The data values from the I/O buffer 148 then may be transferred to the controller via the data bus 150 and the physical I/O interface 118.

For reference, this data transfer operation may be referred to as a STREAM operation. The preceding read process may be referred to as a READ operation. The time that is allocated for the READ operation may be referred to as the read time (tREAD). Although some embodiments described herein may use alternative designations for the read time (tREAD), corresponding to the time from when the READ operation begins to the time when the STREAM operation begins.

Thus, the READ operation pulls the data from the memory elements 126 in the array, through the sense amplifiers 146, into the latched I/O buffer 148. The STREAM operation then begins to stream out the data from the I/O buffer 148 through the package I/O interface pins to the controller 114. Conventionally, the READ operation is a fixed array time operation that must complete before the data can be streamed out to the controller 114.

The illustrated memory control manager 140 also includes a status time register 160 and a read time register 162, which are not provided in conventional memory devices. In one embodiment, the status time register 160 stores a value that indicates when the memory control manager 140 is to set the status bit to a value indicative of either completion of the READ operation or commencement of the STREAM operation. More specifically, the value stored in the status time register 160 may indicate the time at which the memory control manager 140 allows the controller 114 to begin accessing data from the I/O buffer 148. In some embodiments, setting the value in the status time register 160 to a time that is shorter than the default read time of the memory device 116 may allow the controller 114 to access data from the I/O buffer 148 before that data would otherwise be made available. The status time parameter stored in the status time register 160 may be changed autonomously by the memory control manager 140 based on performance metrics of the memory device 116, in response to a prompt from the controller 114, or in response to another external input.

The read time register 162 stores a value that indicates the amount of time that is allocated to the READ operation. In conventional memory devices, the read time of the READ operation is fixed over the life of each device. In embodiments described herein, the amount of time allocated to the READ operation is configurable. In this way, the time allocated to the READ operation may be adjusted over time, for example, to allow faster access early in the device's lifecycle, and slower access later in the device's lifecycle.

As discussed above, the typical time that is allocated to allow the bit-line sense amplifiers 146 to stabilize may increase as the device feature size decreases. This increased stabilization time may depend on the charge per cell and the amount of interference from the bit-line capacitance. However, the stabilization time of conventional devices is statically fixed over the life of those devices.

In embodiments described herein, the memory device 116 may have an adjustable stabilization time. This allows a user or the memory control manager 140 to change, or tune, the time the sense amplifiers 146 are allowed to stabilize. Decreasing this stabilization time will decrease the overall read time of the device. Additionally, decreasing the stabilization time will likely result in higher bit error rates that may be corrected by the ECC capabilities of the controller 114.

Figure 3A:
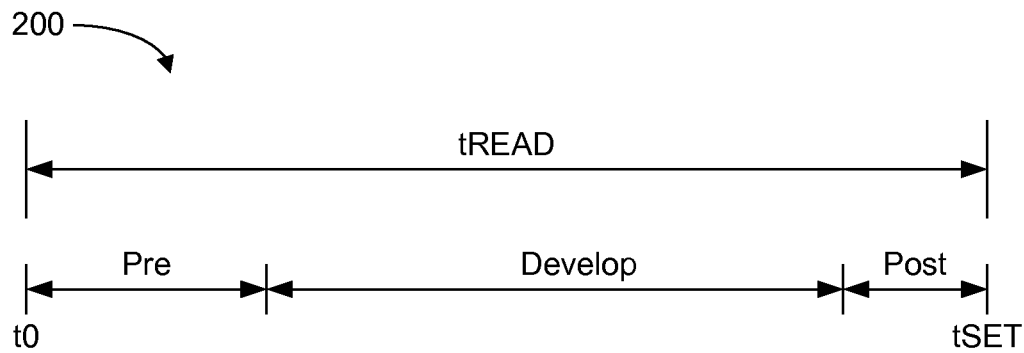
FIG. 3A depicts a graphical diagram of one embodiment of read time (tREAD) for a read operation of the memory array of FIG. 2.

FIG. 3A depicts a graphical diagram 200 of one embodiment of read time (tREAD) for a read operation of the memory array of FIG. 2. The depicted read operation includes three stages: a pre-processing stage, a development stage, and a post-processing stage. In general, the pre-processing stage includes time to build up a charge on certain memory elements 126 so that those memory elements 126 can pass a value of a selected memory element 126 (in a selected row) to be read out from the array. This stage also may be referred to as a pre-charge stage. The development stage includes time for the stored bit values of the selected memory elements 126 to develop, or build up, at the sense amplifiers 146. This is also referred to, in other locations herein, as the stabilization time. The post-processing stage includes time to dissipate any remaining charges within the array. This stage also may be referred to as a post-charge stage.

In conventional memory devices, the read time of the array includes the time for all three of these stages. The time that the pre-processing stage begins is designated as time t0. The time that the post-processing stage ends is designated as tSET, because that is the time when a conventional memory device would set the status bit in the status register 158, and then the data in the I/O buffer 148 would be available for access by the controller 114. The time between t0 and tSET is designated herein as the read time tREAD, which in some implementations may overlap with conventional uses of the same terminology.

Figure 3B:
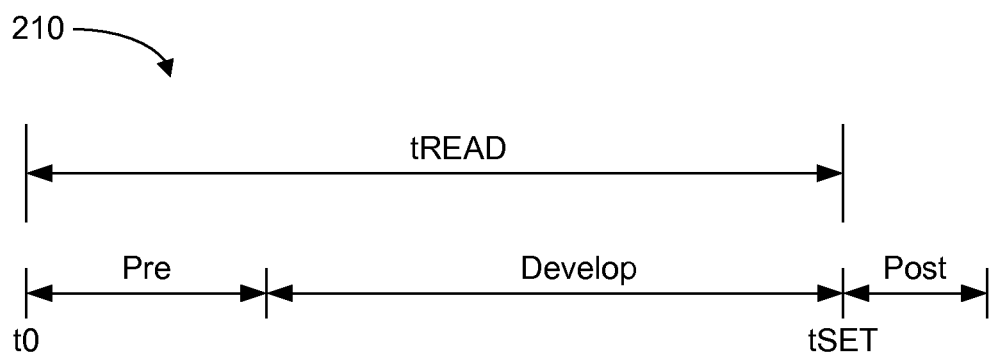
FIG. 3B depicts a graphical diagram of one embodiment of tREAD in which the status register bit is set prior to completion of the post-processing stage of the read process.

FIG. 3B depicts a graphical diagram 210 of one embodiment of tREAD in which the status register bit is set prior to completion of the post-processing stage of the read process. In this embodiment, the read time tREAD is shorter than in conventional devices because the memory control manager 140 does not wait for the completion of the post-pressing stage before setting the status bit in the status register 158. This approach allows the controller 114 to potentially access the data in the I/O buffer 148, via a STREAM operation, before the post-processing stage of the read process has completed. For reference, this approach is one example of an early status protocol, because the memory device 116 sets the status bit early—before all of the stages of the read process are completed.

Figure 3C:
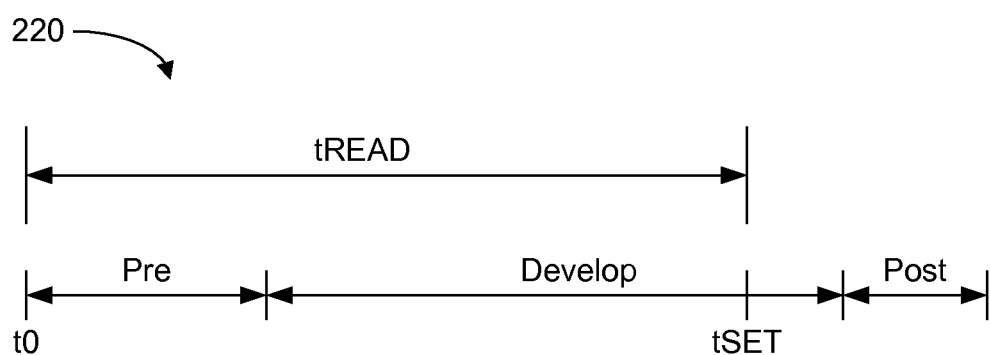
FIG. 3C depicts a graphical diagram of one embodiment of tREAD in which the status register bit is set prior to completion of the development stage of the read process.

FIG. 3C depicts a graphical diagram 220 of one embodiment of tREAD in which the status register bit is set prior to completion of the development stage of the read process. This approach is another example of an early status protocol. While setting the status bit to allow the controller 114 to access the data in the I/O buffer 148 before that data is fully developed, or stabilized, will likely introduce additional bit errors. But as long as the ECC capabilities can compensate for the increase in bit errors, then the increased read speeds may nevertheless warrant the additional ECC processing.

The approaches shown in FIGS. 3B and 3C may be implemented by setting an appropriate value within the status time register 160 of the memory control manager 140. In some embodiments, the value of the status time register 160 may be set in time units such as microseconds. For example, if the designed time for completion of all three stages of the read process is 35 microseconds, then the value of the status time register 160 may be set to a value less than 35 microseconds (e.g., 28, 30, or 32 microseconds). In other embodiments, the value of the status time register 160 may be set as a number of clock cycles. In other embodiments, the value of the status time register 160 may be relative to commencement or completion of one of the stages of the read process. Other embodiments may use other values for the status time register 160. In some embodiments, the value of the status time register 160 is provided by a signal from another component such as the controller 114.

Figure 3D:
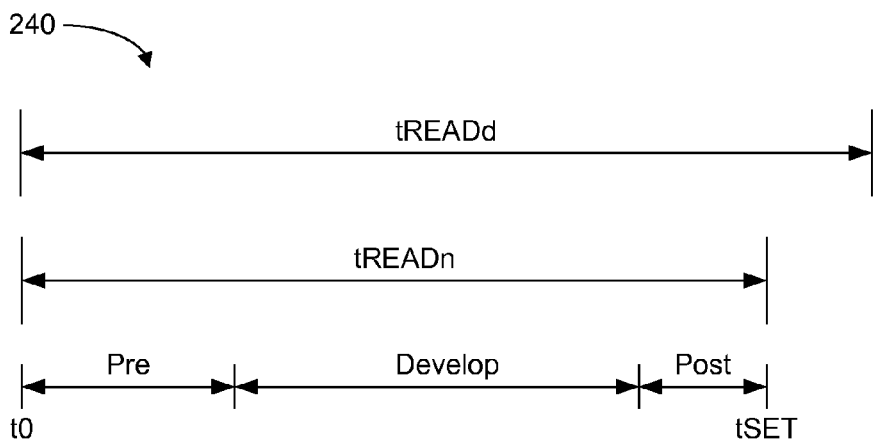
FIG. 3D depicts a graphical diagram of one embodiment of a new read time (tREADn) that is shorter than a default read time (tREADd).
Figure 3E:
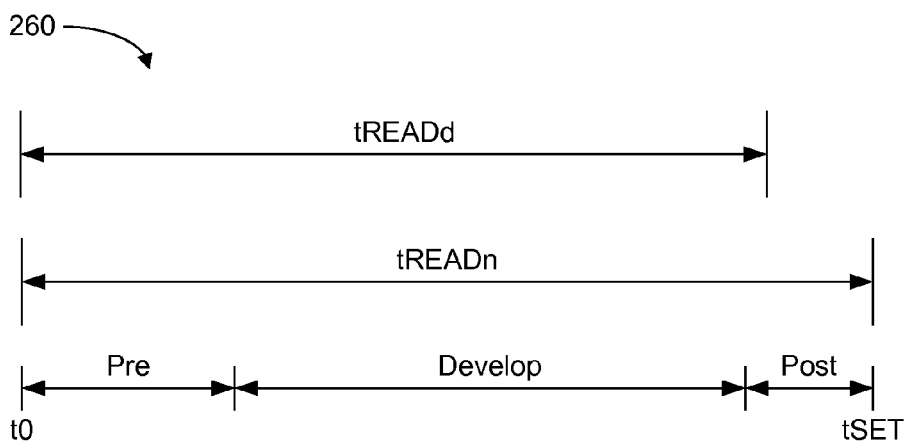
FIG. 3E depicts a graphical diagram of one embodiment of a new read time (tREADn) that is longer than a default read time (tREADd).

FIG. 3D depicts a graphical diagram 240 of one embodiment of a new read time (tREADn) that is shorter than a default read time (tREADd). FIG. 3E depicts a graphical diagram 260 of one embodiment of a new read time (tREADn) that is longer than a default read time (tREADd). Instead of setting the status bit prior to completion of all of the stages of the read process as in FIGS. 3B and 3C, the approach in FIGS. 3D and 3E is to adjust the overall time (or clock cycles) allocated to the read process. The overall time may be adjusted by changing the time (or clock cycles) allocated to one or more of the individual stages. For example, the time (or clock cycles) allocated to the development stage may be decreased or increased to make the overall time of the read process shorter or longer, respectively. For reference, these approaches are examples of a stage duration protocol, because the overall time of the read process can be adjusted by adjusting the time of one or more individual stages.

Figure 4:
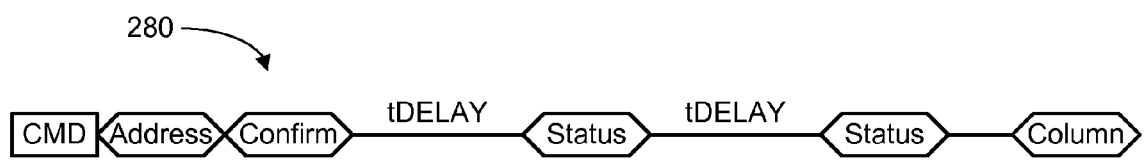
FIG. 4 depicts a graphical timing diagram of one embodiment of a read command progression for one or more of the implementations shown in FIGS. 3A-E.

FIG. 4 depicts a graphical timing diagram 280 of one embodiment of a read command progression for one or more of the implementations shown in FIGS. 3A-E. The illustrated read command progression begins when the controller 114 issues a read command to the memory device 116. The read command includes an address field (e.g., 3 bytes for the row address and 2 bytes for the column address) and a confirmation command field (e.g., 1 byte of 30 hex). After issuing the read command, the controller 114 waits for a delay period tDELAY (e.g., 70 nanoseconds) and then sends a status command inquiry (e.g., 70 or 78 hex) to see if the memory device 116 has set the status bit in the status register 158. In some embodiments, the status command inquiry includes the same column address from the address field, which indicates the starting column for the read command. The controller 114 iteratively waits and checks the status register 158 periodically until notice is received that the status bit is set. At that point, the controller 114 may resend the column address and begins the STREAM operation to transfer the data from the I/O buffer 148 to the controller 114.

Figure 5:
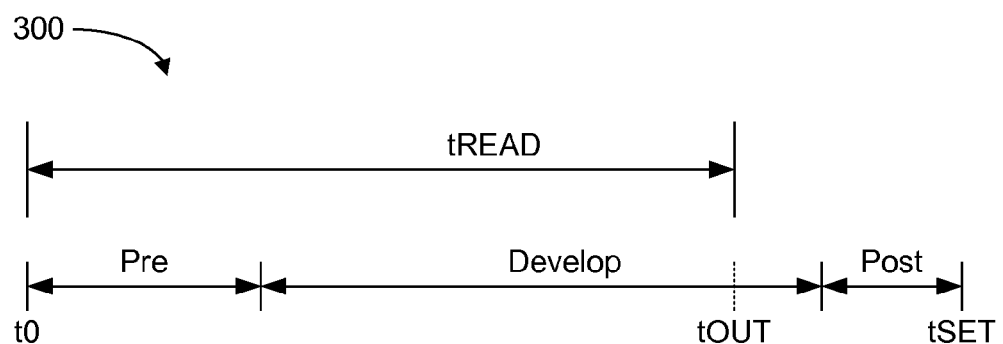
FIG. 5 depicts a graphical diagram of one embodiment of tREAD in which the controller reads out data from the electronic memory device before completion of the read process at the electronic memory device.

FIG. 5 depicts a graphical diagram 300 of one embodiment of tREAD in which the controller 114 reads out data from the electronic memory device 116 before completion of the read process at the electronic memory device 116. In the illustrated embodiment, the controller 114 begins to read out the data from the I/O buffer 148 before the development stage is complete. The time that the controller 114 begins to read data from the I/O buffer 148 is designated as tOUT. In this example, the read time tREAD is the duration between t0 and tOUT. The read time tREAD does not depend, in this example, on the time tSET that the status bit is set in the status register 158 by the memory control manager 140. In other embodiments, the read out time tOUT may be at the end of the development stage, during the post-processing stage, or at another time within the read process. In some embodiments, the read out time tOUT may be after the time tSET that the status bit is set in the status register 158. For reference, this approach is an example of a status disregard protocol, because the controller 114 reads out the data from the I/O buffer 148 without regard for the time tSET that the status bit is set in the status register 158.

Figure 6:
FIG. 6 depicts a graphical timing diagram of one embodiment of a read command progression for the implementation shown in FIG. 5.

FIG. 6 depicts a graphical timing diagram 320 of one embodiment of a read command progression for the implementation shown in FIG. 5. The illustrated read command progression begins when the controller 114 issues a read command to the memory device 116. Similar to the read command of FIG. 4, the read command of FIG. 6 includes an address field (e.g., 3 bytes for the row address and 2 bytes for the column address) and a confirmation command field (e.g., 1 byte of 30 hex). After issuing the read command, the controller 114 waits for a delay period tDELAY. In contrast to the read command progression of FIG. 4, the delay period tDELAY of FIG. 6 is established so that the next transmission is the column address to begin the STREAM operation to transfer the data from the I/O buffer 148 to the controller 114. In some embodiments, the read configuration module 120 of the controller 114 establishes the delay period tDELAY to end at a time (approximately tOUT) that is determined to be prior to the time tSET that the status bit is set in the status register 158 of the memory device 116. For example, if tSET is anticipated to be about 35 microseconds, then the controller 114 may set tDELAY to about 28, 30, or 32 microseconds (or an equivalent number of clock cycles). In this way, the controller 114 unilaterally initiates the read out from the I/O buffer 148 of the memory device 116, regardless of whether or not the memory device 116 has completed all of the stages of the array-side read process and set the status bit in the status register 158.

Figure 7:
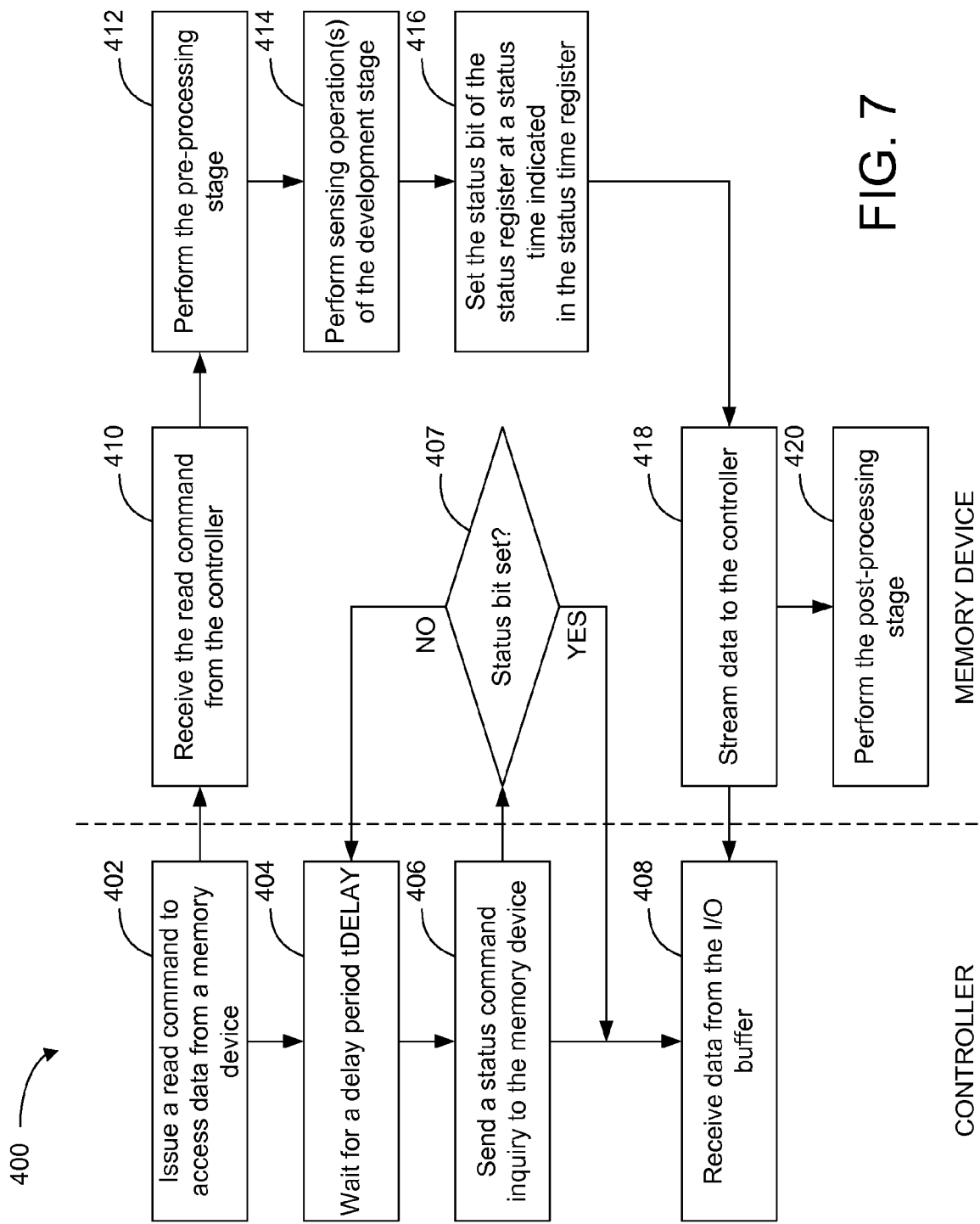
FIG. 7 depicts a flow chart diagram of one embodiment of a method for implementing a read process according to an early status protocol, as shown in FIGS. 3B, 3C, and 4.

FIG. 7 depicts a flow chart diagram of one embodiment of a method 400 for implementing a read process according to an early status protocol, as shown in FIGS. 3B, 3C, and 4. Although the method 400 is shown and described with operations of the controller 114 and memory device 116 of FIG. 1, other embodiments of the method 400 may be implemented with other controllers and/or memory devices.

The illustrated method 400 begins as the controller 114 issues 402 a read command to access data from the memory device 116. The controller 114 then waits 404 for a delay period tDELAY and sends 406 a status command inquiry to the memory device 116. In response to the status command inquiry, the memory device 116 checks 407 to see if the status bit is set in the status register 158 of the memory device 116. If the status bit is not set, then the controller 114 iteratively waits 404 and sends 406 another status command inquiry for the memory device 116 to check 407 the status bit until it is set. Once the status bit is set, the controller receives 408 the data from the I/O buffer 148 of the memory device 116.

At the memory device 116, the memory device 116 receives 410 the read command from the controller 114. The memory device 116 then performs 412 the pre-processing stage and begins 414 the sensing operation(s) to develop the signals at the sense amplifiers 146 during the development stage. In parallel with the pre-processing stage and/or the development stage, the memory device 116 may receive and process one or more status command inquiries from the controller 114, as described above. At the end of the development stage, or alternatively at another point in time before completion of the post-processing stage, the memory device 116 sets 416 the status bit of the status register 158. In one embodiment, the memory control manager 140 sets the status bit of the status register 158 according to a status time value (or clock cycle count) indicated in the status time register 160. Once the status bit is set, the memory device 116 begins a STREAM operation to transfer 418 data from the I/O buffer 148 to the controller 114. After the data is transferred, or while the data is being transferred, to the controller 116, the memory device performs 420 the post-processing stage to complete the read process. The depicted method 400 then ends.

Figure 8:
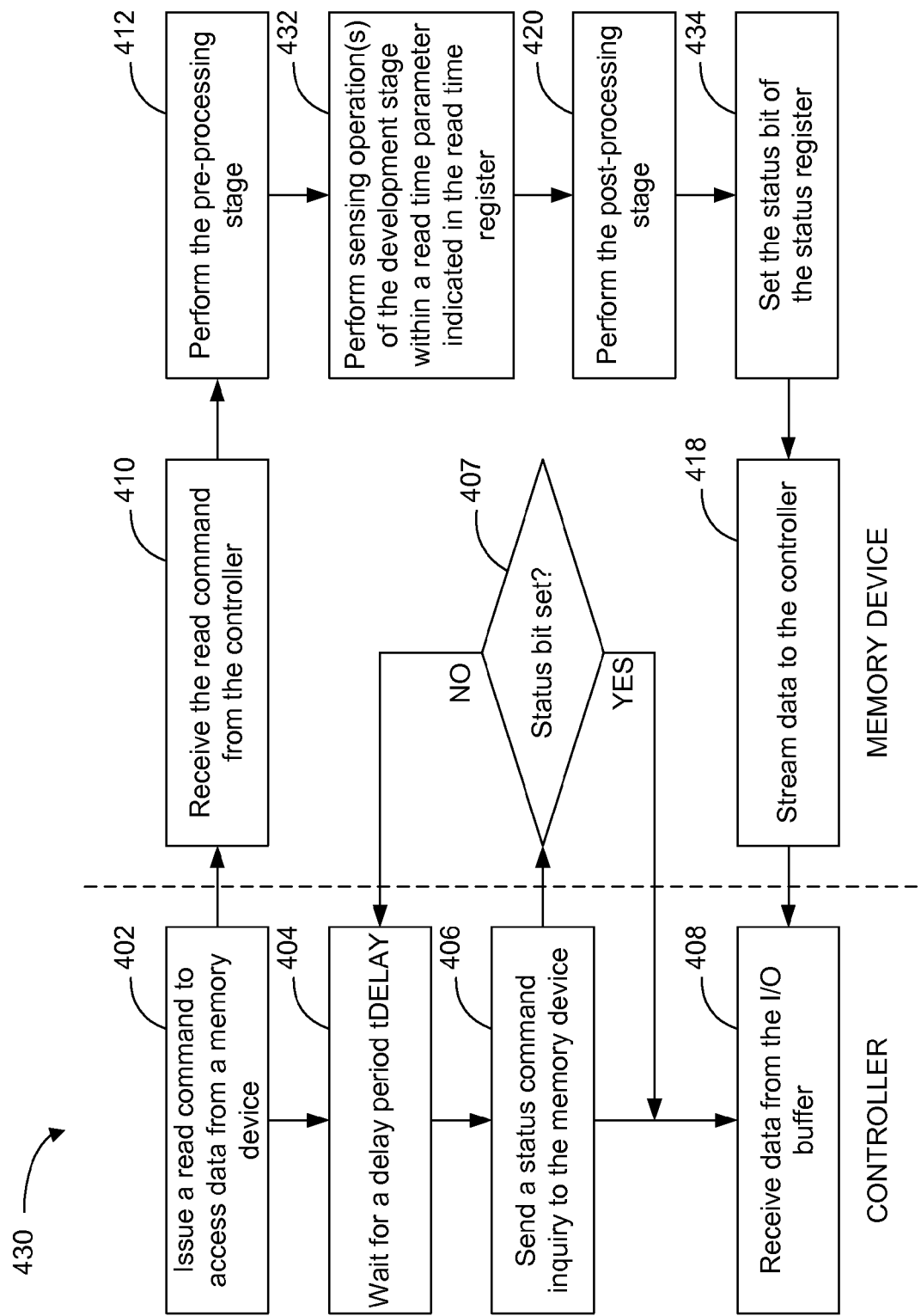
FIG. 8 depicts a flow chart diagram of one embodiment of a method for implementing a read process according to stage duration protocol, as shown in FIGS. 3D, 3E, and 4.

FIG. 8 depicts a flow chart diagram of one embodiment of a method 430 for implementing a read process according to stage duration protocol, as shown in FIGS. 3D, 3E, and 4. Although the method 430 is shown and described with operations of the controller 114 and memory device 116 of FIG. 1, other embodiments of the method 430 may be implemented with other controllers and/or memory devices.

The illustrated method 430 begins as the controller 114 issues 402 a read command to access data from the memory device 116. The controller 114 then waits 404 for a delay period tDELAY and sends 406 a status command inquiry to the memory device 116. In response to the status command inquiry, the memory device 116 checks 407 to see if the status bit is set in the status register 158 of the memory device 116. If the status bit is not set, then the controller 114 iteratively waits 404 and sends 406 another status command inquiry for the memory device 116 to check 407 the status bit until it is set. Once the status bit is set, the controller receives 408 the data from the I/O buffer 148 of the memory device 116.

At the memory device 116, the memory device 116 receives 410 the read command from the controller 114. The memory device 116 then performs 412 the pre-processing stage and begins 432 the sensing operation(s) to develop the signals at the sense amplifiers 146 during the development stage. In one embodiment, the memory device completes the development stage within a read time parameter indicated in the read time register 162 of the memory control manager 140. The read time parameter may specify time units, clock cycles, or another equivalent quantity. At the end of the development stage, the memory device performs 420 the post-processing stage and sets 434 the status bit of the status register 158. In parallel with the pre-processing stage, the development stage, and/or the post-processing stage, the memory device 116 may receive and process one or more status command inquiries from the controller 114, as described above. Once the status bit is set, the memory device 116 begins a STREAM operation to transfer 418 data from the I/O buffer 148 to the controller 114. The depicted method 430 then ends.

Figure 9:
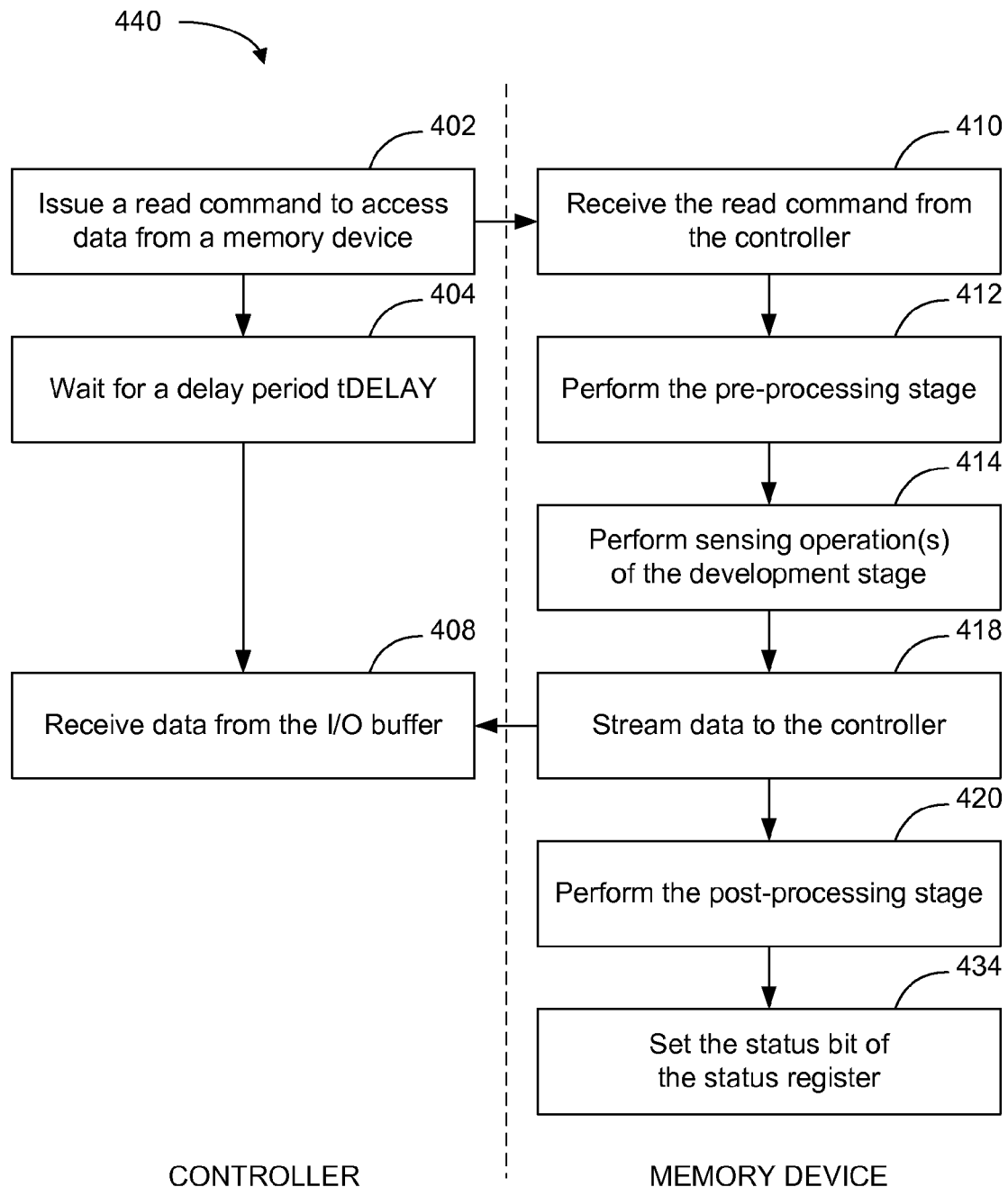
FIG. 9 depicts a flow chart diagram of one embodiment of a method for implementing a read process according to a status disregard protocol, as shown in FIGS. 5 and 6.

FIG. 9 depicts a flow chart diagram of one embodiment of a method 440 for implementing a read process according to a status disregard protocol, as shown in FIGS. 5 and 6. Although the method 440 is shown and described with operations of the controller 114 and memory device 116 of FIG. 1, other embodiments of the method 440 may be implemented with other controllers and/or memory devices.

The illustrated method 440 begins as the controller 114 issues 402 a read command to access data from the memory device 116. The controller 114 then waits 404 for a delay period tDELAY that is anticipated to be long enough for sufficient development of the signals at the sense amplifiers 146 of the memory device 116. After completion of the delay period, the controller receives 408 the data from the I/O buffer 148 of the memory device 116.

At the memory device 116, the memory device 116 receives 410 the read command from the controller 114. The memory device 116 then performs 412 the pre-processing stage and begins 414 the sensing operation(s) to develop the signals at the sense amplifiers 146 during the development stage. At the end of the development stage, or alternatively at another point in time during the development stage, the memory device 116 begins a STREAM operation to transfer 418 data from the I/O buffer 148 to the controller 114. After the data is transferred, or while the data is being transferred, to the controller 114, the memory device 116 performs 420 the post-processing stage to complete the read process. In one embodiment, the memory device 116 then sets 434 the status bit of the status register 158. In another embodiment, the memory device 116 may omit or skip setting 434 the status bit in the status register 158 if it is determined that the data transfer to the controller 114 has already been initiated and/or completed. The depicted method 440 then ends.

Figure 10:
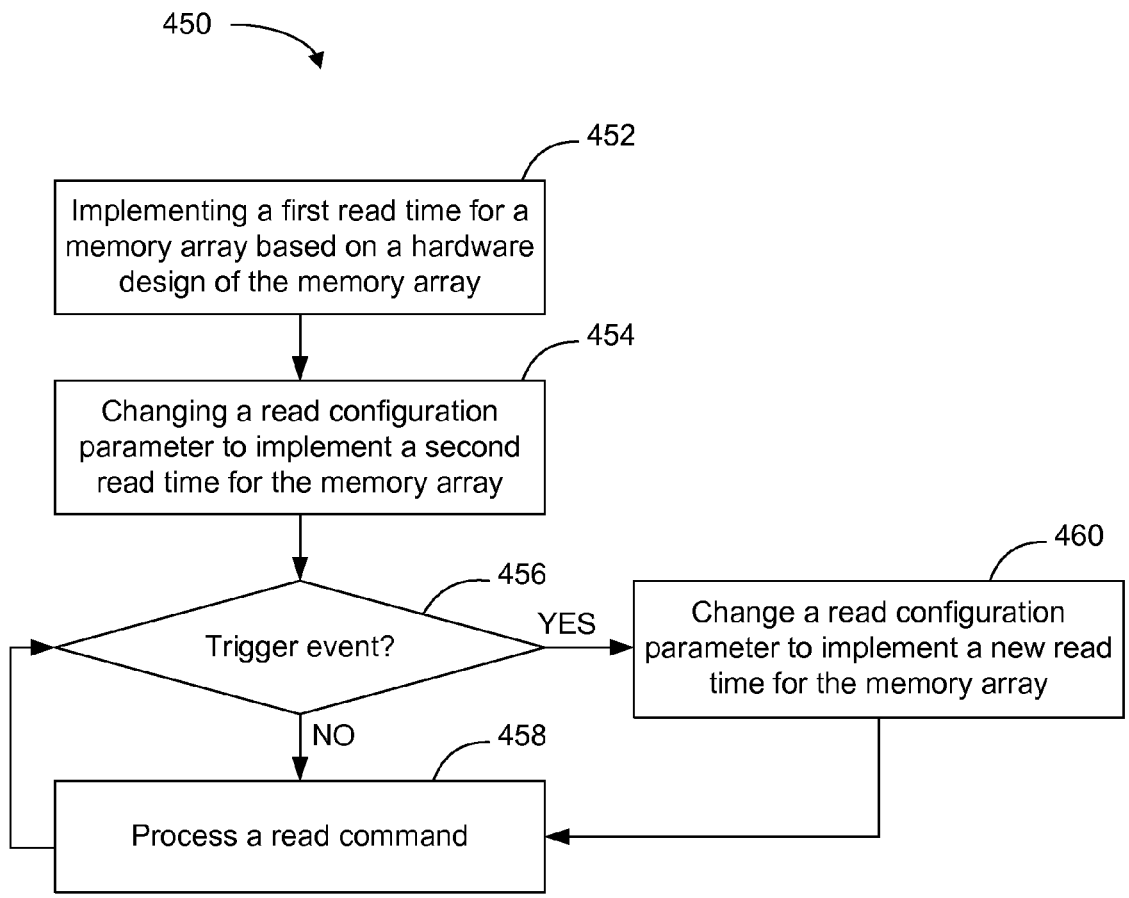
FIG. 10 depicts a flow chart diagram of one embodiment of a method for implementing a process to dynamically change a read time tREAD of the memory device of FIG. 2.

FIG. 10 depicts a flow chart diagram of one embodiment of a method 450 for implementing a process to dynamically change a read time tREAD of the memory device 116 of FIG. 2. Although the method 450 is shown and described with operations of the memory device 116 of FIG. 1, other embodiments of the method 450 may be implemented with other memory devices.

The illustrated method 450 begins as the memory device 116 implements 452 a first read time (e.g., a default read time tREADd) based on a hardware design of the memory array within the memory device 116. Alternatively, this operation 452 may be omitted from some embodiments of the method 450. The memory device 116 then changes 454 a read configuration parameter of the memory device 116 to implement a second read time (e.g., a new read time tREADn) that is different from the first read time. The read configuration parameters may include any of the parameters described above such as, but are not limited to, a status time parameter, a read time parameter, and so forth. In some embodiments, the default read time tREADd is established by a manufacturer for performance under end-of-life circumstances. In comparison, the new read time tREADn may be established by a user or automatically by the controller 114 for initial performance when the memory device 116 is relatively new (e.g., has performed less than a threshold number of P/E cycles).

Over the course of operation of the memory device 116, the controller 114 and/or the memory device 116 monitors 456 for a trigger event. The trigger event may be any type of predefined trigger event such as, but not limited to, a decrease in BER below a threshold, an increase in BER above a threshold, an increase in P/E cycles above a threshold, a manual input from a user, an automated input from another processing resource, and so forth. As long as no trigger event is detected, the memory device 116 continues to process 458 read commands using the second read time. However, once a trigger event is detected, the memory device 116 changes 460 a read configuration parameter to implement a new read time (e.g., tREADn') that is different from the second read time (e.g., tREADn). The memory device 116 then processes 458 subsequent read commands using the new read time. This process of monitoring for trigger events and changing read configuration parameters may continue over the life of the memory device 116, or until such functionality is terminated. In this way, the memory device 116, either autonomously or with the direction of the controller 114, may update the level of performance that is available from the memory device 116 by changing the read time tREAD that is experienced by the controller 114.

While many embodiments are described herein, some embodiments relate to an electronic memory device controller. The controller includes an input/output (I/O) interface to couple the controller to an I/O buffer of an electronic memory device. The electronic memory device includes a memory array with a plurality of memory elements. The controller also includes a read module coupled to the I/O interface. The read module reads data from the memory array of the electronic memory device. The controller also includes a read configuration module coupled to the read module. The read configuration module changes a read time (tREAD) of the memory array. The read time of the memory array includes an array time between initiating a read process and when data at the I/O buffer is transferrable to the I/O interface. In some embodiments, the read configuration module initiates a data transfer from the I/O buffer of the electronic memory device to the I/O interface of the controller prior to completion of a post-processing stage of the read process at the electronic memory device. In some embodiments, the read configuration module initiates the data transfer from the I/O buffer of the electronic memory device to the I/O interface of the controller prior to completion of a development stage of the read process at the electronic memory device. In some embodiments, the read configuration module changes a time at which the electronic memory device is configured to set a status register bit, indicative that the data is available at the I/O buffer, to a time prior to completion of a post-processing operation of the read process at the electronic memory device. In some embodiments, the read configuration module changes a time at which the electronic memory device is configured to set a status register bit, indicative that the data is available at the I/O buffer, to a time prior to completion of a development operation of the read process at the electronic memory device. In some embodiments, the read configuration module changes a time at which the electronic memory device is configured to set a status register bit, indicative that the data is available at the I/O buffer, to a time prior to a time when a status register bit is set at the electronic memory device. In some embodiments, the read configuration module changes a number of overall clock cycles allocated to the read process of the memory array. In some embodiments, the read configuration module monitors for a trigger event and changes the read time of the memory array in response to the trigger event. In some embodiments, the trigger event includes a prior change in a raw bit error rate (RBER) parameter associated with the memory array. In some embodiments, the trigger event includes a prior change in a program/erase (P/E) cycle count associated with an erase block of the memory array. In some embodiments, the controller also includes an error correction module coupled to the read configuration module. The error correction module implements an error correction code (ECC) to compensate for a subsequent change in the RBER parameter resulting from the change in the read time of the memory array. In some embodiments, the read configuration module changes the read time of the memory array approximately simultaneously with changing a read time of another memory array of a different die within the same electronic memory device.

Other embodiments described herein relate to an electronic memory device. The electronic memory device includes a memory array, an input/output (I/O) buffer, and a memory control manager. The memory array includes a plurality of memory elements, and each memory element is configured to store data. The I/O buffer is coupled to the memory array to store buffered data accessible to an I/O interface of an electronic memory device controller. The memory control manager is coupled to the memory array. The memory control manager changes a read time (tREAD) of the memory array. The read time of the memory array comprises an array time between initiating a read process and making data at the I/O buffer available to the I/O interface of the controller. In some embodiments, the memory control manager includes a status register and a status time register. The status register stores a status bit indicative of a ready state of the data at the I/O buffer. The status time register stores a status time parameter for the status register. The status time parameter is indicative of an elapsed time at which to set the status bit in the status register, following initiation of the read process at the electronic memory device. In some embodiments, the status time parameter is different from a default read time of the memory array. In some embodiments, the memory control manager sets the status time parameter to a value that is less than a read process completion time. In some embodiments, the memory control manager includes a read time register to store a new read time (tREADn), which is different from a default read time (tREADd) established by a manufacturer of the memory array. In some embodiments, the memory control manager implements a pre-processing stage, a development stage, and a post-processing stage within the new read time. The memory control manager also may allocate a first number of clock cycles to the pre-processing stage, a second number of clock cycles to the development stage, and a third number of clock cycles to the post-processing stage, (or to one or more of the stages) in order to accommodate the new read time. In some embodiments, the memory control manager changes the read time of the memory array in response to a prompt from the controller.

Other embodiments described herein relate to a method for controlling a read time of an electronic memory device. The method includes implementing a first read time indicative of an array time for a read process for the electronic memory device to make data available at an I/O buffer for access by a controller. The method also includes implementing a second read time for the electronic memory device. The second read time has a total duration which is different from the first read time. In some embodiments, the method also includes recognizing a trigger event. The trigger event may include a change in a raw bit error rate (RBER) parameter associated with the memory array. The method also may include changing the read time of the memory array in response to the trigger event. In some embodiments, implementing the second read time includes initiating a STREAM operation to transfer data from the I/O buffer to the controller prior to completion of all stages of the read process at the electronic memory device. In some embodiments, implementing the second read time includes setting a status bit at the electronic memory device prior to completion of all stages of the read process at the electronic memory device. In some embodiments, implementing the second read time includes changing a number of clock cycles allocated to at least one stage of a plurality of stages of the read process at the electronic memory device. In some embodiments, implementing the second read time includes storing at the electronic memory device a new read time (tREADn), which is different from a default read time (tREADd) established by a manufacturer of the memory array.

Other embodiments described herein relate to a computer program product which includes a computer readable storage medium to store a computer readable program that, if executed on a computing device, causes the computing device to perform operations for reading data of a memory array within an electronic memory device. In one embodiment, the operations include initiating a STREAM operation to transfer data from the I/O buffer to the controller prior to completion of all stages of the read process at the electronic memory device. In some embodiments, the operations include implementing a first read time indicative of an array time for a read process for the electronic memory device to make data available at an I/O buffer for access by a controller. The operations also include implementing a second read time for the electronic memory device. The second read time has a total duration which is different from the first read time. In some embodiments, the operations also include occasionally monitoring a raw bit error rate (RBER) parameter associated with the memory array, and changing the read time of the memory array in response to a change in the RBER parameter beyond a threshold. In some embodiments, the operations also include initiating the STREAM operation to transfer the data from the I/O buffer to the controller prior to the electronic memory device setting a status bit to indicate availability of the data at the I/O buffer. In some embodiments, the operations also include storing at the electronic memory device a new read time (tREADn), which is different from a default read time (tREADd) established by a manufacturer of the memory array.

Other embodiments described herein relate to a system which includes means for sending a first read command to an electronic memory device. The electronic memory device includes a NAND flash memory device. The system also includes means for processing the read command according to a first read time (tREAD) protocol, means for sending a second read command to the electronic memory device, and means for processing the second read command according to a second read time protocol. The second read time protocol establishes a second read time that is different from a first read time of the first read time protocol. In some embodiments, the system also includes means for implementing the first and second read time protocols from a plurality of read time protocols, which include a status disregard protocol, an early status protocol, and a stage duration protocol. Under the status disregard protocol, the controller initiates a STREAM operation to transfer data from an I/O buffer of the electronic memory device without consideration for a value of a status bit in a status register of the electronic memory device. Under the early status protocol, the electronic memory device sets the status bit in the status register prior to completion of all stages of a read process. Under the stage duration protocol, the electronic memory device completes all stages of the read process within a specific time frame.

An embodiment of the electronic memory device controller 114 includes at least one processor coupled directly or indirectly to memory elements through a system bus such as a data, address, and/or control bus. The memory elements can include local memory employed during actual execution of the program code, bulk storage, and cache memories which provide temporary storage of at least some program code in order to reduce the number of times code must be retrieved from bulk storage during execution.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Embodiments of the invention can take the form of an entirely hardware embodiment, an entirely software embodiment, or an embodiment containing both hardware and software elements. In one embodiment, the invention is implemented in software, which includes but is not limited to firmware, resident software, microcode, etc.

Furthermore, embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Input/output or I/O devices (including but not limited to keyboards, displays, pointing devices, etc.) can be coupled to the system either directly or through intervening I/O controllers. Additionally, network adapters also may be coupled to the system to enable the data processing system to become coupled to other data processing systems or remote printers or memory devices through intervening private or public networks. Modems, cable modems, and Ethernet cards are just a few of the currently available types of network adapters.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An electronic memory device controller comprising:
an input/output (I/O) interface configured to couple the controller to an I/O buffer of an electronic memory device, wherein the electronic memory device comprises a memory array with a plurality of memory elements;
a read module coupled to the I/O interface, wherein the read module is configured to request a read operation for data from the memory array of the electronic memory device; and
wherein the read module is configured to initiate a transfer of the data from the I/O buffer prior to completion of one or more stages of the read operation for the data on the electronic memory device.

2. The controller of claim 1, wherein the read module is configured to initiate the transfer from the I/O buffer of the electronic memory device to the I/O interface of the controller prior to completion of a post-processing stage of the read operation at the electronic memory device.

3. The controller of claim 1, wherein the read module is configured to initiate the transfer from the I/O buffer of the electronic memory device to the I/O interface of the controller prior to a time when a status register bit is set at the electronic memory device.

4. The controller of claim 1, further comprising a read configuration module configured to change a time at which the electronic memory device sets a status register bit, indicative that the data is available at the I/O buffer, to a time prior to completion of a post-processing operation of the read operation at the electronic memory device.

5. The controller of claim 1, further comprising a read configuration module configured to change a time at which the electronic memory device is configured to set a status register bit, indicative that the data is available at the I/O buffer, to a time prior to completion of a development operation of the read operation at the electronic memory device.

6. The controller of claim 1, further comprising a read configuration module configured to change a number of overall clock cycles allocated to the read operation of the memory array.

7. The controller of claim 1, further comprising a read configuration module configured to monitor for a trigger event, and to change a read time of the memory array in response to the trigger event.

8. The controller of claim 7, wherein the trigger event comprises a prior change in program/erase (P/E) cycle count associated with an erase block of the memory array.

9. The controller of claim 7, further comprising an error correction module coupled to the read configuration module, wherein the error correction module is configured to implement an error correction code (ECC) to compensate for a subsequent change in the RBER parameter resulting from the change in the read time of the memory array.

10. The controller of claim 1, further comprising a read configuration module configured to change a read time of the memory array in relation to a characteristic of ECC protection provided by the controller.

11. The controller of claim 1, further comprising a read configuration module configured to change a read time of the memory array approximately simultaneously with changing a read time of a memory array of a different die within the same electronic memory device.

12. An electronic memory device comprising:
a memory array with a plurality of memory elements, wherein each memory element is configured to store data;
an input/output (I/O) buffer coupled to the memory array, wherein the I/O buffer is configured to store buffered data of a read process for the memory array; and
a memory control manager coupled to the memory array, wherein the memory control manager is configured to signal completion of the read process for the memory array before one or more stages of the read process within the memory array have completed.

13. The electronic memory device of claim 12, wherein the memory control manager comprises:
a status register to store a status bit indicative of a ready state of the data at the I/O buffer; and
wherein the memory control manager is configured to signal completion of the read process by setting the status bit of the status register to indicate the ready state of the data.

14. The electronic memory device of claim 13, wherein the memory control manager further comprises a status time register to store a status time parameter for the status register, wherein the status time parameter is indicative of an elapsed time at which to set the status bit in the status register, following initiation of the read process at the electronic memory device, the status time parameter being different from a default read time of the memory array.

15. The electronic memory device of claim 14, wherein the memory control manager is further configured to set the status time parameter to a value that is less than a read process completion time.

16. The electronic memory device of claim 12, wherein the memory control manager comprises a read time register to store a new read time (tREADn), wherein the new read time is different from a default read time (tREADd) established by a manufacturer of the memory array.

17. The electronic memory device of claim 16, wherein the memory control manager is further configured to implement a pre-processing stage, a development stage, and a post-processing stage within the new read time, and the memory control manager is further configured to allocate a first number of clock cycles to the pre-processing stage, a second number of clock cycles to the development stage, and a third number of clock cycles to the post-processing stage, in order to accommodate the new read time.

18. The electronic memory device of claim 12, wherein the memory control manager is further configured to change a read time of the memory array in response to a prompt from a controller.

19. A method comprising:
initiating a read process for a memory array of an electronic memory device to make data available at an I/O buffer for access by a controller; and
signaling completion of the read process prior to completion of one or more stages of the read process at the memory array.

20. The method of claim 19, further comprising:
recognizing a trigger event, wherein the trigger event comprises a change in a raw bit error rate (RBER) parameter associated with the memory array; and
changing a first read time of the memory array to a second read time in response to the trigger event.

21. The method of claim 19, further comprising initiating a STREAM operation to transfer data from the I/O buffer to the controller prior to completion of the one or more stages of the read process.

22. The method of claim 19, wherein signaling completion of the read process to the controller comprises setting a status bit at the electronic memory device prior to completion of the one or more stages of the read process.

23. The method of claim 19, further comprising changing a number of clock cycles allocated to at least one stage of a plurality of stages of the read process at the electronic memory device.

24. The method of claim 19, further comprising storing a new read time (tREADn) at the electronic memory device, wherein the new read time is different from a default read time (tREADd) established by a manufacturer of the memory array.

25. A computer program product comprising:
a computer readable storage medium configured to store a computer readable program that, if executed on a computing device, causes the computing device to perform operations for reading data of a memory array within an electronic memory device, wherein the operations comprise:
initiating a read operation to read data from the memory array of the electronic memory device; and
initiating a STREAM operation to transfer data from the I/O buffer to the controller prior to completion of all stages of the read process at the electronic memory device.

26. The computer program product of claim 25, wherein the computer readable program, if executed on the computer, causes the computing device to perform further operations comprising:
monitoring a raw bit error rate (RBER) parameter associated with the memory array; and
changing the read time of the memory array in response to a change in the RBER parameter beyond a threshold.

27. The computer program product of claim 25, wherein the computer readable program, if executed on the computer, causes the computing device to perform further operations comprising:
- implementing a first read time indicative of an array time for a read process for the electronic memory device to make data available at an I/O buffer for access by a controller; and
- implementing a second read time for the electronic memory device, wherein the second read time has a total duration which is different from the first read time.

28. The computer program product of claim 25, wherein the computer readable program, if executed on the computer, causes the computing device to perform further operations comprising:
- initiating the STREAM operation to transfer the data from the I/O buffer to the controller prior to the electronic memory device setting a status bit to indicate availability of the data at the I/O buffer.

29. The computer program product of claim 25, wherein the computer readable program, if executed on the computer, causes the computing device to perform further operations comprising:
- storing a new read time (tREADn) at the electronic memory device, wherein the new read time is different from a default read time (tREADd) established by a manufacturer of the memory array.

30. A system comprising:
- means for sending a first read command to an electronic memory die, wherein the electronic memory die comprises a NAND flash memory device;
- means for processing the read command according to a first read time (tREAD) protocol;
- means for sending a second read command to the electronic memory die; and
- means for processing the second read command according to a second read time protocol, wherein the second read time protocol establishes a second read time that is different from a first read time of the first read time protocol.

31. The system of claim 30, further comprising means for implementing the first and second read time protocols from a plurality of read time protocols, wherein the plurality of read time protocols comprise:
- a default manufacturer protocol, wherein the controller is configured to set a status bit in a status register of the electronic memory die in response to completion of all stages of a read process;
- a status disregard protocol, wherein the controller is configured to initiate a STREAM operation to transfer data from an I/O buffer of the electronic memory die without consideration for a value of the status bit in the status register of the electronic memory die;
- an early status protocol, wherein the electronic memory die is configured to set the status bit in the status register prior to completion of all stages of the read process; and
- a stage duration protocol, wherein the electronic memory die is configured to complete all stages of the read process within a specific time frame.

\* \* \* \* \*